(12) United States Patent
Kim et al.

(10) Patent No.: US 7,696,074 B2
(45) Date of Patent: Apr. 13, 2010

(54) METHOD OF MANUFACTURING NAND FLASH MEMORY DEVICE

(75) Inventors: Jum Soo Kim, Icheon-si (KR); Jung Ryul Ahn, Namyangju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 735 days.

(21) Appl. No.: 11/446,475

(22) Filed: Jun. 2, 2006

(65) Prior Publication Data
US 2007/0087538 A1    Apr. 19, 2007

(30) Foreign Application Priority Data
Oct. 14, 2005    (KR) .................. 10-2005-0096913

(51) Int. Cl.
*H01L 21/3205* (2006.01)
*H01L 21/4763* (2006.01)
(52) U.S. Cl. .............. 438/586; 257/E21.507; 257/E21.682
(58) Field of Classification Search .......... 438/586; 257/E21.507, E21.682
See application file for complete search history.

(56) References Cited

U.S. PATENT DOCUMENTS 6,306,760 B1   10/2001  Hsu et al.
2005/0142729 A1*  6/2005  Shin et al. ............ 438/231

FOREIGN PATENT DOCUMENTS

| KR | 1020010065285 |   | 7/2001 |
| KR | 1020030002711 | A | 1/2003 |
| KR | 1020040071527 | A | 8/2004 |
| KR | 1020040074389 | A | 8/2004 |
| KR | 1020040105949 | A | 12/2004 |
| KR | 1020060075364 | A | 7/2006 |

* cited by examiner

Primary Examiner—W. David Coleman
Assistant Examiner—Sonya D McCall-Shepard
(74) Attorney, Agent, or Firm—Marshall, Gerstein & Borun LLP

(57) ABSTRACT

A method of manufacturing a NAND flash memory device, including the steps of forming gates over a semiconductor substrate; forming a junction region over the semiconductor substrate between the gates; forming a buffer oxide film on the gates and the semiconductor substrate; stripping the buffer oxide film at one side of the gates; forming a nitride film spacers over the sidewalls of the gates; forming a self-aligned contact process (SAC) nitride film and an insulating film over the entire structure; etching regions of the insulating film and the SAC nitride film to form a contact through which the junction region is exposed; and forming a conductive film to bury the contact, thereby forming a contact plug.

9 Claims, 3 Drawing Sheets

METHOD OF MANUFACTURING NAND FLASH MEMORY DEVICE

BACKGROUND

1. Field of the Invention

The invention relates generally to a method of manufacturing a flash memory device. More particularly, the invention relates to a method of manufacturing a NAND flash memory device.

2. Discussion of Related Art

A method of manufacturing a NAND flash memory device in the related art is described below with reference to FIGS. 1A and 1B, which illustrate a gate formation process of a select transistor region, which is formed using the same process when a cell gate is formed in a cell region.

Referring to FIG. 1A, a tunnel oxide film 102, a first polysilicon film 103, a dielectric film 104, a second polysilicon film 105, a tungsten film 106, and a hard mask film 107 are sequentially formed on a semiconductor substrate 101, thereby forming a gate electrode in which a floating gate and a control gate are stacked and form a gate electrode having the same stack structure as that of the gate electrode in a select transistor region.

Thereafter, to remove micro trenches and plasma damage occurring upon etching of the gate, an oxidization process is performed to form an oxide film 108 on the gate sidewalls (preferably, the sidewalls of the first and second polysilicon films 103, 105).

An ion implantation process is carried out to form a junction unit 109 serving as the source and drain. After a first buffer oxide film 110 is formed on the entire structure, a nitride film 111 is formed. A blanket etch process is then performed to form spacers on the gate sidewalls.

Referring to FIG. 1B, after a second buffer oxide film 112 and a SAC nitride film 113 are formed on the entire structure, an insulating film 114 is formed in order to provide insulation between gate lines and insulation with an upper line.

Thereafter, regions of the insulating film 114, the SAC nitride film 113, and the second buffer oxide film 112 are etched using a SAC etch process, forming a contact through which the junction unit 109 is exposed. A conductive film 115 is formed to bury the contact, thereby forming a contact plug.

However, as devices become more highly integrated, the thickness of the hard mask film 107 gradually decreases. Furthermore, since the first buffer oxide film 110 is removed during the SAC etch process, the conductive film 115 is connected to the tungsten film 106. Accordingly, since the gate electrode and the contact plug may create a short circuit, the device may fail.

SUMMARY OF THE INVENTION

In one embodiment, the invention provides a method of manufacturing a NAND flash memory device; which method can prevent a problem in which a gate and a contact plug create a short circuit due to the removal of a buffer oxide film on the sidewalls of the gate in the process of exposing a junction region of a select transistor through a self-aligned contact (SAC) process and forming the contact plug.

In another embodiment, the invention provides a method of manufacturing a NAND flash memory device, which method can solve the above-mentioned problem by removing the buffer oxide film formed at one side of the select transistor gate before the SAC process.

Accordingly, one embodiment of the invention provides a method of manufacturing a NAND flash memory device, including the steps of forming gates over a semiconductor substrate; forming a junction region over the semiconductor substrate between the gates; forming a buffer oxide film on the gates and the semiconductor substrate; stripping the buffer oxide film at one side of the gates; forming a nitride film spacers over the sidewalls of the gates; forming a self-aligned contact process (SAC) nitride film and an insulating film over the entire structure; etching regions of the insulating film and the SAC nitride film to form a contact through which the junction region is exposed; and forming a conductive film to bury the contact, thereby forming a contact plug.

The buffer oxide film may preferably be formed to a thickness of about 50 Å about to 700 Å. The buffer oxide film may be etched to about 10 Å to about 50 Å in thickness.

According to another embodiment, the invention provides a method of manufacturing a NAND flash memory device, including the steps of forming gates over a semiconductor substrate; forming a junction region over the semiconductor substrate between the gates; forming a buffer oxide film on the gates and the semiconductor substrate; forming a nitride film spacers on sidewalls of the gates; stripping the buffer oxide film between the gates and the nitride film spacers under an oxide film over-etch condition; forming a nitride film at the portion from which the buffer oxide film has been stripped; forming a self-aligned contact process (SAC) nitride film and an insulating film on the entire structure; etching regions of the insulating film and the SAC nitride film to form a contact through which the junction region is exposed; and forming a conductive film to bury the contact, thereby forming a contact plug.

Preferably, in an oxide film over-etch process, a removal target of the oxide film is set to about 500 Å to about 1000 Å. The nitride film may preferably be formed to a thickness of about 50 Å to about 100 Å using a low-pressure chemical vapor deposition (LPCVD) method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention is described in detail in connection with certain exemplary embodiments with reference to the accompanying drawings.

FIGS. 2A to 2D are cross-sectional views illustrating a method of manufacturing a NAND flash memory device according to an embodiment of the invention. FIGS. 2A to 2D are cross-sectional views of gates of a select transistor region that is formed using the same process when a cell gate is formed in a cell region.

Figure 1A:
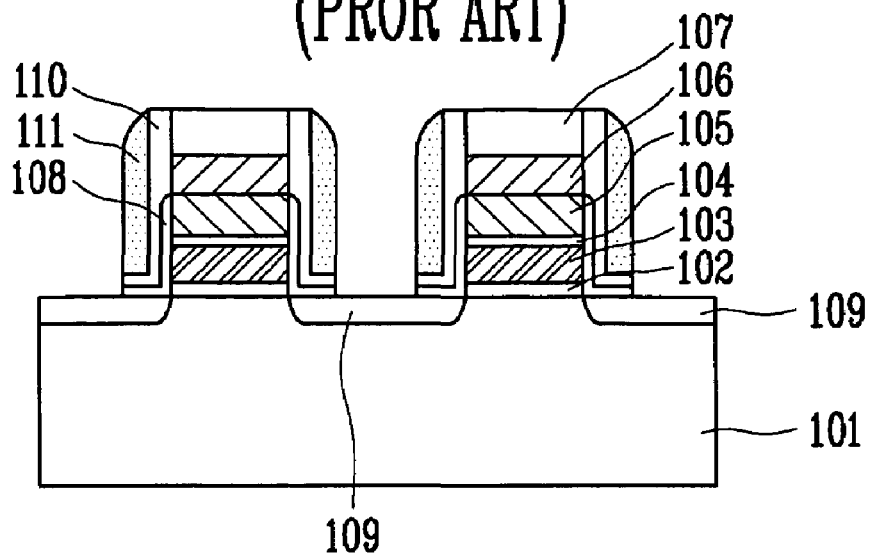
FIGS. 1A and 1B are cross-sectional views illustrating a method of manufacturing a NAND flash memory device in the related art.
Figure 1B:
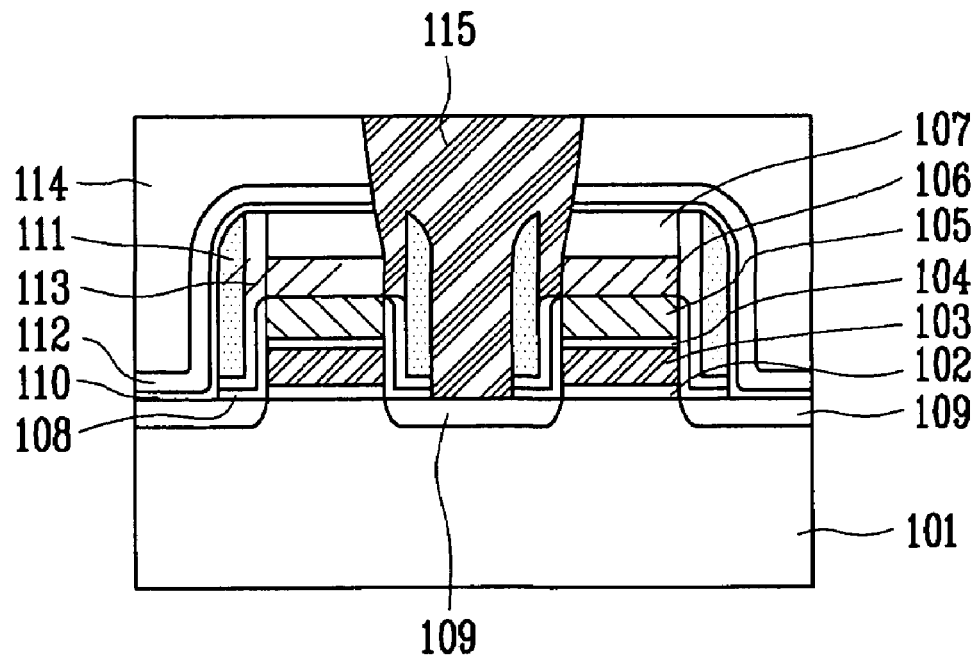
Figure 2A:
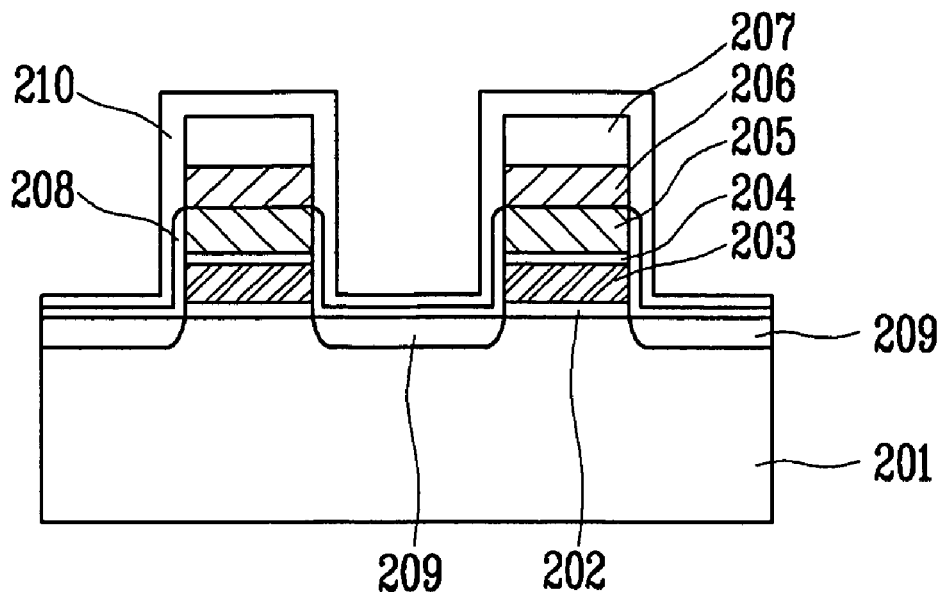
FIGS. 2A to 2D are cross-sectional views illustrating a method of manufacturing a NAND flash memory device according to an embodiment of the invention.

Referring to FIG. 2A, a tunnel oxide film 202, a first polysilicon film 203, a dielectric film 204, a second polysilicon film 205, a tungsten film 206, and a hard mask film 207 are sequentially formed on a semiconductor substrate 201, thereby forming a gate electrode in which a floating gate and a control gate are stacked and also forming a gate electrode having the same stack structure as that of the gate electrode in a select transistor region.

Thereafter, to remove micro trenches and plasma damage occurring upon etching of the gate, an oxidization process is performed to form an oxide film 208 on the gate sidewalls (preferably, the sidewalls of the first and second polysilicon films 203, 205).

An ion implantation process is carried out to form a junction unit 209 serving as the source and drain. A first buffer oxide film 210 is formed on the entire structure. The first buffer oxide film 210 may be formed to a thickness of about 50 Å to about 700 Å.

Figure 2B:
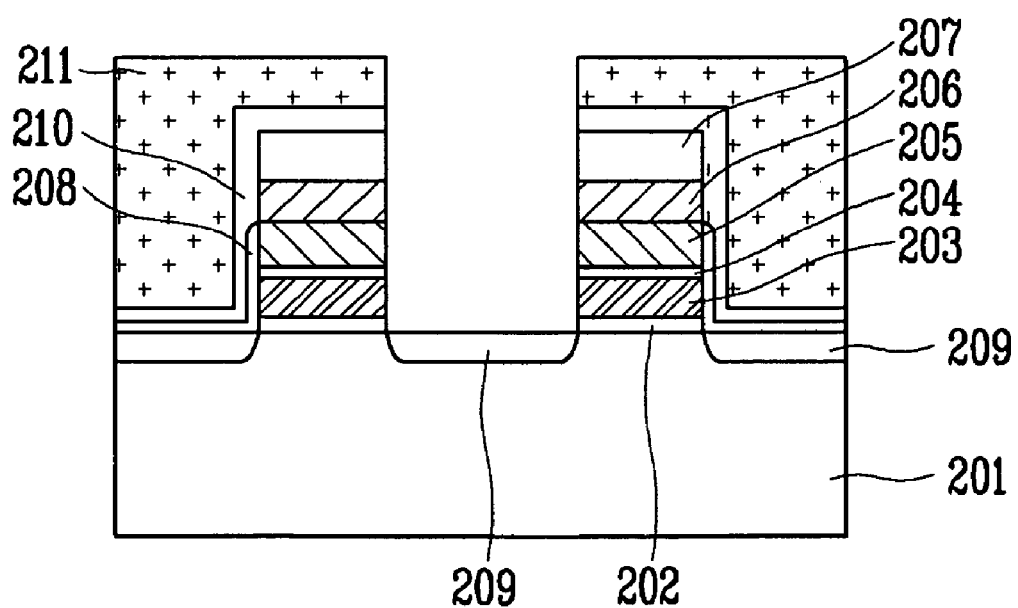

Referring to FIG. 2B, a photoresist film 211 is formed on the entire structure and is then patterned using a mask through which the select transistor region is exposed. Thereafter, the oxide film 208 and the first buffer oxide film 210 formed on the gate sidewalls of the select transistor region are stripped using the patterned photoresist film 211 as a mask.

The etch process for stripping the first buffer oxide film 210 may be performed using a wet etch or dry etch process so that the oxide film remains about 10 Å to about 50 Å in thickness.

Figure 2C:
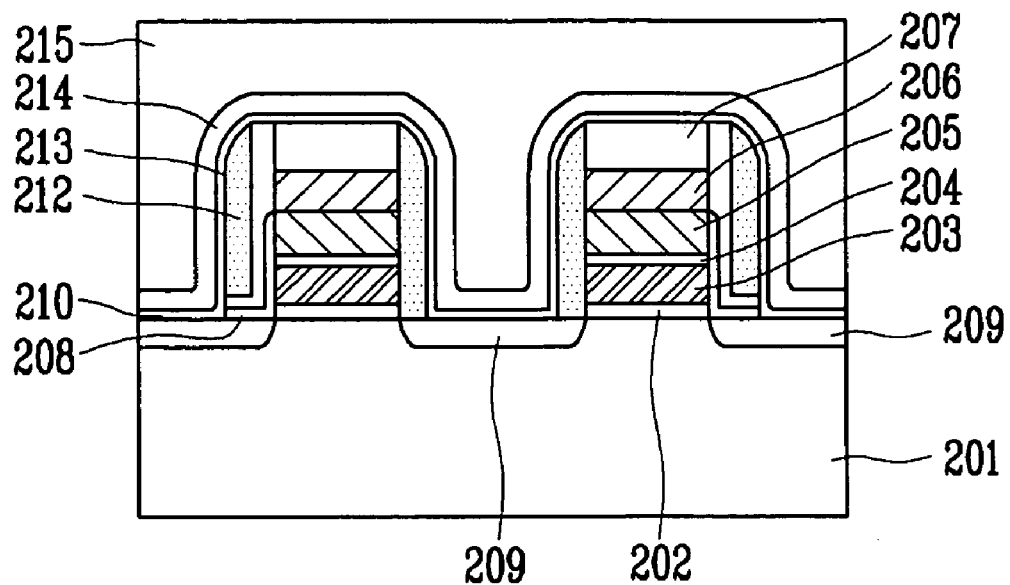

Referring to FIG. 2C, after the photoresist film 211 is stripped, a nitride film 212 is formed on the entire structure. A blanket etch process is then performed to form spacers on the gate sidewalls. A second buffer oxide film 213 and a SAC nitride film 214 are formed on the entire structure. An insulating film 215 for providing insulation between gate lines and insulation with an upper line is then formed.

Figure 2D:
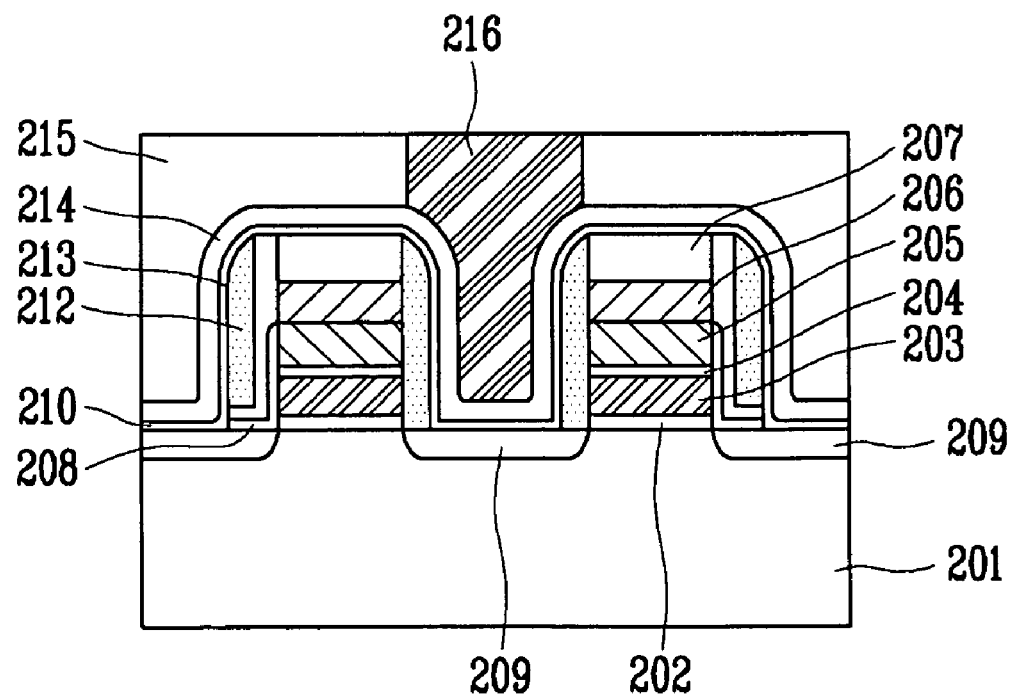

Referring to FIG. 2D, regions of the insulating film 215, the SAC nitride film 214, and the second buffer oxide film 213 are etched using a SAC etch process, forming a contact through which the junction unit 209 is exposed. A conductive film 216 is formed to bury the contact, thereby forming a contact plug.

Meanwhile, according to another embodiment of the invention, after the nitride film spacers are formed on the gate sidewalls, wet over-etch in which a removal target of the oxide film is set to about 500 Å to about 1000 Å may be performed to remove the first buffer oxide film between the gate and the nitride film spacers. A nitride film having a thickness of about 50 Å to about 100 Å is formed at the portion from which the first buffer oxide film has been removed by means of a LPCVD method. Subsequent processes, such as a second buffer oxide film formation process and a SAC nitride film formation process, are then performed.

As described above, according to the invention, the buffer oxide film formed at one side of the gate is stripped by the SAC process before the junction region of the select transistor region is exposed. It is therefore possible to solve the problem in which the contact plug and the gate creates a short circuit. Accordingly, the invention is advantageous in that it can sufficiently secure SAC process margin and can improve the reliability of devices.

While the invention has been described in connection with practical exemplary embodiments, the invention is not limited to the disclosed embodiments, but, on the contrary, is intended to cover various modifications and equivalent arrangements included within the spirit and scope of the appended claims.

What is claimed is:

1. A method of manufacturing a NAND flash memory device, the method comprising:
    forming first and second gates over a semiconductor substrate, each of the first and second gates including first and second sidewalls, wherein the first sidewall of the first gate is opposed to the second sidewall of the second gate;
    forming a junction region in the semiconductor substrate between the first and second gates;
    forming a buffer oxide film on the first and second gates and the semiconductor substrate;
    stripping the buffer oxide film at the first sidewall of the first gate and at the second sidewall of the second gate;
    forming nitride film spacers over each of the first sidewall of the first gate, the second sidewall of the second gate, and the buffer oxide film remaining on the second sidewall of the first gate and the first sidewall of the second gate;
    forming a self-aligned contact process (SAC) nitride film and an insulating film over the nitride film spacers;
    etching the insulating film and the SAC nitride film between the first and the second gates to expose the junction region, thereby forming a contact hole; and
    forming a conductive film over the insulating film including the contact hole,
    wherein the nitride film spacers are formed after stripping the buffer oxide film at the first sidewall of the first gate and at the second sidewall of the second gate.

2. The method of claim 1, wherein the buffer oxide film is formed to a thickness of about 50 Å to about 700 Å.

3. The method of claim 1, wherein the buffer oxide film remains to a thickness of about 10 Å to about 50 Å after stripping the buffer oxide film.

4. The method of claim 1, wherein the first and the second gates are formed of a tunnel insulating layer, floating gate layer, a dielectric layer, and the control gate layer.

5. The method of claim 1, wherein the buffer oxide film is stripped by wet etching process.

6. A method of manufacturing a NAND flash memory device, the method comprising:
    forming gates over a semiconductor substrate;
    forming a junction region in the semiconductor substrate between the gates;
    forming a buffer oxide film on the gates and the semiconductor substrate;
    forming nitride film spacers on sidewalls of the gates;
    stripping the buffer oxide film between the gate and the nitride film spacer under an oxide film over-etch condition;
    forming a nitride film at the portion from which the buffer oxide film has been stripped;
    forming a self-aligned contact process (SAC) nitride film and an insulating film on the entire structure after forming the nitride film;
    etching the insulating film and the SAC nitride film between the gate to expose the junction region, thereby forming a contact hole; and
    forming a conductive film over the insulating film including the contact hole.

7. The method of claim 6, wherein the oxide film over-etch condition includes a removal target of the oxide film of about 500 Å to about 1000 Å.

8. The method of claim 6, wherein the nitride film is formed to a thickness of about 50 Å to about 100 Å using a low-pressure chemical vapor deposition method.

9. The method of claim 6, wherein the gates are formed of a tunnel insulating layer, floating gate layer, a dielectric layer, and the control gate layer.

* * * * *